United States Patent
Jia et al.

(10) Patent No.: US 10,381,822 B2
(45) Date of Patent: Aug. 13, 2019

(54) ORING CONTROL USING LOW VOLTAGE DEVICE FOR HIGH VOLTAGE DC RACK

(71) Applicant: Google LLC, Mountain View, CA (US)

(72) Inventors: Liang Jia, Sunnyvale, CA (US); Xin Li, San Jose, CA (US)

(73) Assignee: Google LLC, Mountain View, CA (US)

( * ) Notice: Subject to any disclaimer, the term of this patent is extended or adjusted under 35 U.S.C. 154(b) by 333 days.

(21) Appl. No.: 15/375,833

(22) Filed: Dec. 12, 2016

(65) Prior Publication Data
US 2018/0166873 A1    Jun. 14, 2018

(51) Int. Cl.
| | | |
|---|---|---|
| G06F 1/26 | (2006.01) |
| H02H 3/28 | (2006.01) |
| H02H 9/00 | (2006.01) |
| H02H 9/04 | (2006.01) |
| H02J 1/06 | (2006.01) |
| H03K 17/0812 | (2006.01) |

(52) U.S. Cl.
CPC .......... H02H 3/28 (2013.01); G06F 1/26 (2013.01); H02H 9/005 (2013.01); H02H 9/04 (2013.01); H02J 1/06 (2013.01); H03K 17/08122 (2013.01)

(58) Field of Classification Search
CPC . H02H 3/28; H02H 9/005; H02H 9/04; G06F 1/26; H02J 1/06; H03K 17/08122
USPC .......................................................... 361/86
See application file for complete search history.

(56) References Cited

U.S. PATENT DOCUMENTS

| | | | |
|---|---|---|---|
| 5,945,816 A | 8/1999 | Marusik | |
| 5,999,417 A | 12/1999 | Schlecht | |
| 6,894,468 B1 | 5/2005 | Bretz et al. | |
| 7,206,800 B1 | 4/2007 | Bentz | |
| 7,379,282 B1 * | 5/2008 | Zansky | H02J 1/108 361/18 |

(Continued)

FOREIGN PATENT DOCUMENTS

JP    S5954319 A    3/1984

OTHER PUBLICATIONS

International Search Report and Written Opinion for International Application No. PCT/US2017/053941 dated Jan. 9, 2018. 14 pages.

(Continued)

Primary Examiner — Kevin J Comber
(74) Attorney, Agent, or Firm — Lerner, David, Littenberg, Krumholz & Mentlik, LLP

(57) ABSTRACT

A protection circuits for server racks may include an Oring circuit having a first MOSFET, a first diode, and first and second comparators. Each of the first and second comparators supports a maximum voltage difference that is less than an operational voltage of the power supply. The protection circuit also includes a clamping circuit having a second MOSFET and a second diode. Each of the first and second comparators is configured to compare voltage at the first MOSFET with voltage at the second MOSFET. The first comparator is configured to switch the first MOSFET to an off condition using the comparison, and the second comparator is configured to switch the first MOSFET to an on condition using the comparison. The second MOSFET is configured to clamp a node of each of the first and second comparators to below the maximum in the event of a short at the power supply.

20 Claims, 10 Drawing Sheets

(56) References Cited

U.S. PATENT DOCUMENTS

| | | |
|---|---|---|
| 7,466,573 B2 | 12/2008 | Kojori et al. |
| 7,558,083 B2 | 7/2009 | Schlecht |
| 2009/0257162 A1* | 10/2009 | Garrett .................. H02H 9/004 361/86 |
| 2009/0285001 A1 | 11/2009 | Hu et al. |
| 2015/0016005 A1 | 1/2015 | Simonson et al. |

OTHER PUBLICATIONS

Kando, Bob, "High-Voltage ORing with Low-Voltage Controllers" (Oct. 2008), 7 pgs.
Crews, Ron, "Controller Monitors ORing FET Current and Voltage" (Sep. 2007), 2 pgs.
Texas Instruments Incorporated, "Full Featured N+1 and ORing Power Rail Controller" (Nov. 2006-2009), 32 pgs.
Brewster, Rick, "A Low Loss Replacement for an ORing Diode" (May 2004), 4 pgs.
Maxim Integrated Products, Inc., "Dual ORing, Single Hot-Swap Controller with Accurate Current Monitoring" (2016), 17 pgs.

\* cited by examiner

ORING CONTROL USING LOW VOLTAGE DEVICE FOR HIGH VOLTAGE DC RACK

BACKGROUND

Server systems that provide Internet-based services, such as those that provide cloud-based processing and storage solutions, typically rely on racks to house and supply power to the load devices that provide such services. As time goes on and the demands on these systems increase, the load devices used in these racks, such as power conversion devices, motherboards, processing chips (e.g., central processing units, graphical processing units, etc.), network switches, accelerators, etc., may become more and more powerful. At the same time, with the increase in power typically comes an increase in energy or power required to support such devices. Thus, the power needed to service these racks is and will continue to increase with time.

Many such server systems rely on 48 volt (V) DC (direct current) power supply systems, where each rack receives 48V DC to supply power to the load devices. In such racks, the maximum power is around tens of kilowatts (kW). When the power density of the load devices becomes a few times higher, these 48V DC power systems may no longer be sufficient to bring power to the trays of the racks. In other words, the higher input voltage to the rack for distribution to the trays, the more power can deliver with the same amount of copper for bus bars of these racks.

High voltage power supply systems, such as 400V DC, allow for greater power distribution and fewer stages of power conversions for 12V powered server computing devices as compared to 48 Vdc. This greater power also creates greater efficiency in the system with ten times the power capacity for the same structural power supply (bus bar). In this regard, 400V DC distribution racks are becoming more and more appealing to Internet technology companies such as those that provide cloud-based processing and storage solutions.

SUMMARY

One aspect of the disclosure provides A system for protecting server racks connected to a power supply. The system includes an Oring circuit including a first MOSFET, a first diode connected in parallel with the first MOSFET, and first and second comparators operatively coupled to the first MOSFET. Each of the first and second comparators support a maximum voltage difference that is less than an operational voltage of the power supply. The system also includes a clamping circuit including a second MOSFET and a second diode operatively coupled to the Oring circuit. Each of the first and second comparators is configured to compare voltage at the first MOSFET with voltage at the second MOSFET. The first comparator is configured to switch the first MOSFET to an off condition according to the compared voltage and the second comparator is configured to switch the first MOSFET to an on condition according to the compared voltage. The second MOSFET is configured to clamp a node of the first comparator and a node of the second comparator to below the maximum voltage difference when there is a short at the power supply.

In one example, each of the first and second comparators support voltages of no more than 20V. In this example, the system also includes a server rack. In addition, an operational voltage of the power supply when the power supply supplies power to operate computing components of the server rack is greater than 48V. In such examples, the operational voltage of the power supply when the power supply supplies power to operate computing components of the server rack is 400V.

In another example, the second diode is a Schottky diode configured to clamp transient spikes. In another example, the system also includes the power supply. In another example, the system also includes a Hotswap controller configured with a third MOSFET such that the third MOSFET is arranged with the Oring circuit and clamping circuit to disconnect a load from the power supply when there is a load side short of the system. In another example, the clamping circuit further includes a resistor that limits current from the power supply to the second MOSFET.

In another example, the Oring circuit also includes a third diode configured as a single sided hysteresis clamping diode. In this example, the Oring circuit also includes first and second resistors such that the third diode and the first and second resistors are arranged to reduce a voltage value of a threshold of the first comparator when the first MOSFET is switched to the on condition. In this example, the first comparator is arranged to have a first threshold for switching the first MOSFET to the on condition when the first MOSFET is operating in a linear region or in the off condition, and the first comparator has a second threshold for keeping the first MOSFET in the on condition when the first MOSFET is already operating in the on condition. The first threshold is a greater voltage than the second threshold. In this example, the second comparator has a single voltage threshold for switching the first MOSFET to the off condition, such that when voltage at the second MOSFET is greater than the single voltage threshold, the second comparator will cause the first MOSFET to switch to the off condition.

Another aspect of the disclosure provides a protection circuit for protecting server racks connected to a power supply. The protection circuit includes an Oring circuit including a first MOSFET, a first diode connected in parallel with the first MOSFET, and first and second comparators operatively coupled to the first MOSFET. Each of the first and second comparators support a maximum voltage difference that is less than an operational voltage of the power supply. The protection circuit also includes a clamping circuit including a second MOSFET and a second diode operatively coupled to the Oring circuit, and a Hotswap controller configured with a third MOSFET. Third MOSFET is arranged with the Oring circuit and clamping circuit to disconnect a load from the power supply when there is a load side short of the protection circuit. Each of the first and second comparators are configured to compare voltage at the first MOSFET with voltage at the second MOSFET. The first comparator is configured to switch the first MOSFET to an off condition according to the compared voltage and the second comparator is configured to switch the first MOSFET to an on condition according to the compared voltage. The second MOSFET is configured to clamp a node of the first comparator and a node of the second comparator to below the maximum voltage difference when there is a short at the power supply.

In one example, each of the first and second comparators supports voltages of less than 20V. In another example, the second diode is a Schottky diode that clamps transient spikes. In another example, the clamping circuit further includes a resistor which limits current from the power supply to the second MOSFET. In another example, the Oring circuit also includes a third diode configured as a single sided hysteresis clamping diode D3. In this example, the Oring circuit also includes first and second resistors such that the third diode and the first and second resistors are arranged to reduce a voltage value of a threshold of the first comparator when the first MOSFET is switched to the on condition. In addition, the first comparator is arranged to have a first threshold for switching the first MOSFET to the on condition when the first MOSFET is operating in a linear region or in the off condition, and the first comparator has a second threshold for keeping the first MOSFET in the on condition when the first MOSFET is already operating in the on condition. The first threshold is a greater voltage than the second threshold.

DETAILED DESCRIPTION

Overview

Figure 1:
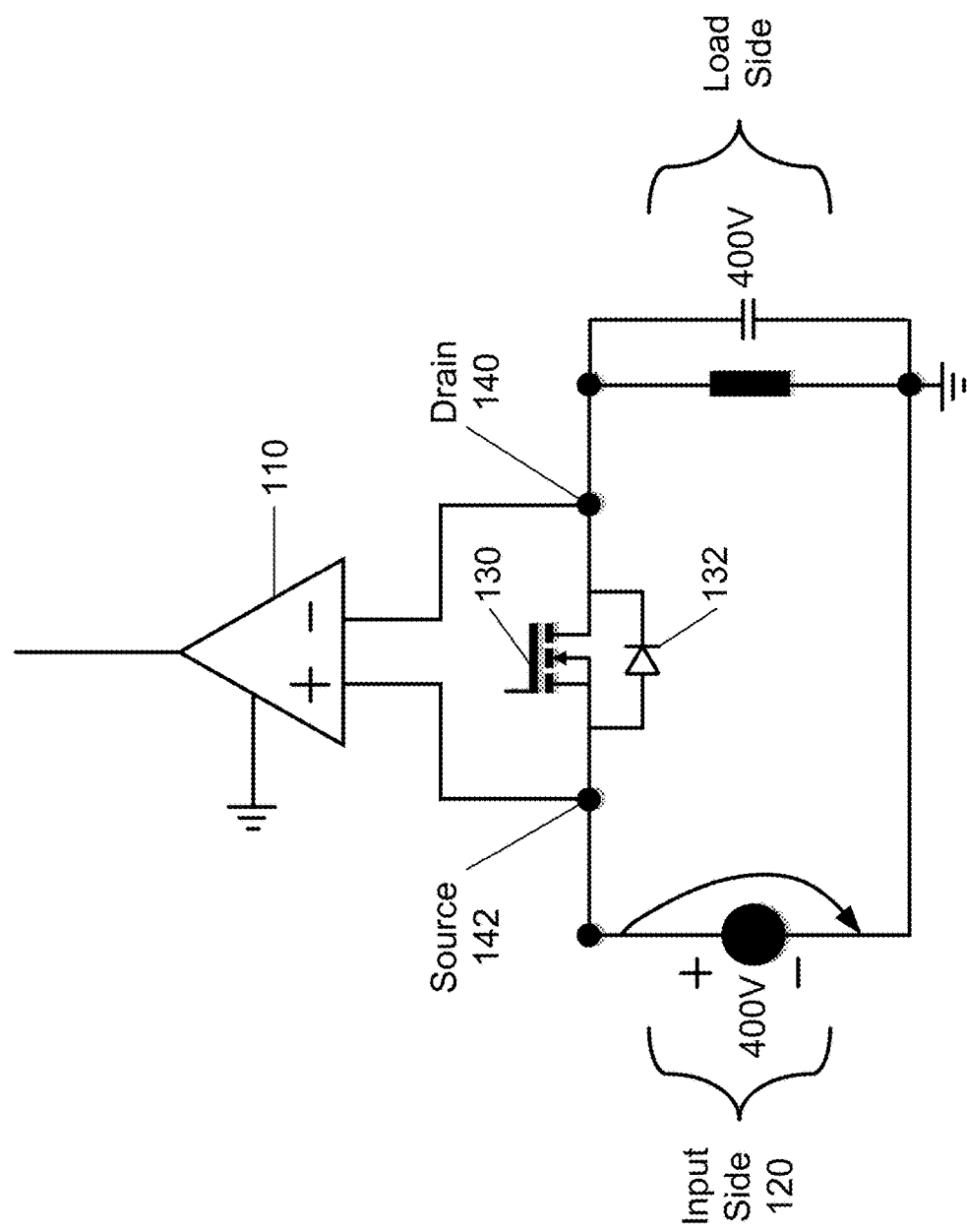
FIG. 1 is an example protection circuit in accordance with implementations of the disclosure.

To ensure safe and reliable function of the racks connected to the high voltage power supply, each rack may include a protection circuit that includes hotswap and Oring functionality. For instance, the protection circuit may include an Oring circuit including a Oring metal-oxide semiconductor field effect transistor ("MOSFET") switch and a diode connected in parallel with the MOSFET. The MOSFET has an on condition, a linear mode, and an off condition. During startup, or when the power source initially begins to provide power to the protection circuit, the Oring MOSFET will be conducted via a body diode (of the MOSMOSFET) and eventually turned to the on condition. When a short occurs at a load side of the protection circuit from which the load devices receive power, a hotswap MOSFET will be switched to the off condition. When an input short occurs at the input side of the protection circuit, where the power supply system provides power to the protection circuit, an Oring controller will sense a negative or reverse current flow, switching the Oring MOSFET to the off condition immediately so that holdup capacitor energy can be reserved for the load devices.

In one example, a high common voltage difference amplifier may be arranged on the "high" or input side of a protection circuit to sense current flowing through an Oring MOSFET. However, the high common voltage difference amplifier can be an expensive component, and during normal operation using a high voltage power supply, if the input side has a short, the drain of the Oring MOSFET will see the high voltage of the power supply and the source of the Oring MOSFET will see very low voltage. Thus, the differential voltage at the amplifier can be as high as the voltage of the high voltage power supply, potentially resulting in damage to the protection circuit.

Alternatively, a low common voltage differential amplifier may be used on the low side of a protection circuit to sense the current flowing through the Oring MOSFET. This will require that the comparator is referred to the output ground load. As such, when the input side has a short and the source voltage of the Oring MOSFET is very low, the high voltage of the power supply will be applied to the drain of the Oring MOSFET, which again may result in damage to the protection circuit. In addition, this is only feasible for low side sensing.

To address these deficiencies with the low common voltage difference amplifier of the aforementioned protection circuits and to allow for high side and low side sensing, a clamping circuit and an additional low common voltage differential amplifier may be included with the Oring circuit in the protection circuit. The clamping circuit may include an additional MOSFET, a resistor and a diode.

The additional MOSFET may acts to clamp one of the nodes of each of the amplifiers so that when the input side of the protection circuit has as short, the voltage on those nodes will be clamped to below the maximum rating of the amplifier. This additional MOSFET may be arranged in parallel with the Oring MOSFET such that the additional MOSFET acts as a source follower. During normal operation, the Oring MOSFET and the additional MOSFET will be in the on condition.

The pair of amplifiers may be used for detecting two events: 1) a large positive voltage during reverse conduction and 2) a large negative voltage during start up. Each amplifier receives the source voltage for each of the Oring and additional MOSFET. One of the amplifiers uses the comparison of these voltages to turn the Oring MOSFET to the on condition. This amplifier is arranged with a single sided hysteresis clamping diode for one-direction hysteresis. The other amplifier is configured to turn the Oring MOSFET to the off condition based on the comparison.

EXAMPLES

Referring to the Oring functionality, in one example protection circuit 100 shown in FIG. 1, a high common voltage differential amplifier 110 may be used. As shown, the high common voltage difference amplifier 110 is arranged on the input or "high" side 120 to sense current flowing through an Oring circuit including an Oring MOSFET 130 and a diode 132 connected in parallel with the Oring MOSFET. In this example, the voltage to the protection circuit at the input side 120 is 400V. However, the high common voltage difference amplifier 110 can be an expensive component, and during normal operation, if the input side has a short, the drain 140 of the Oring MOSFET M3 will see 400V. At the same time, the source 142 will see very low voltage (i.e., close to zero). As a result, the differential voltage on the high common voltage difference amplifier 110 will be as much as 400V, potentially resulting in damage to the protection circuit 100.

Figure 2:
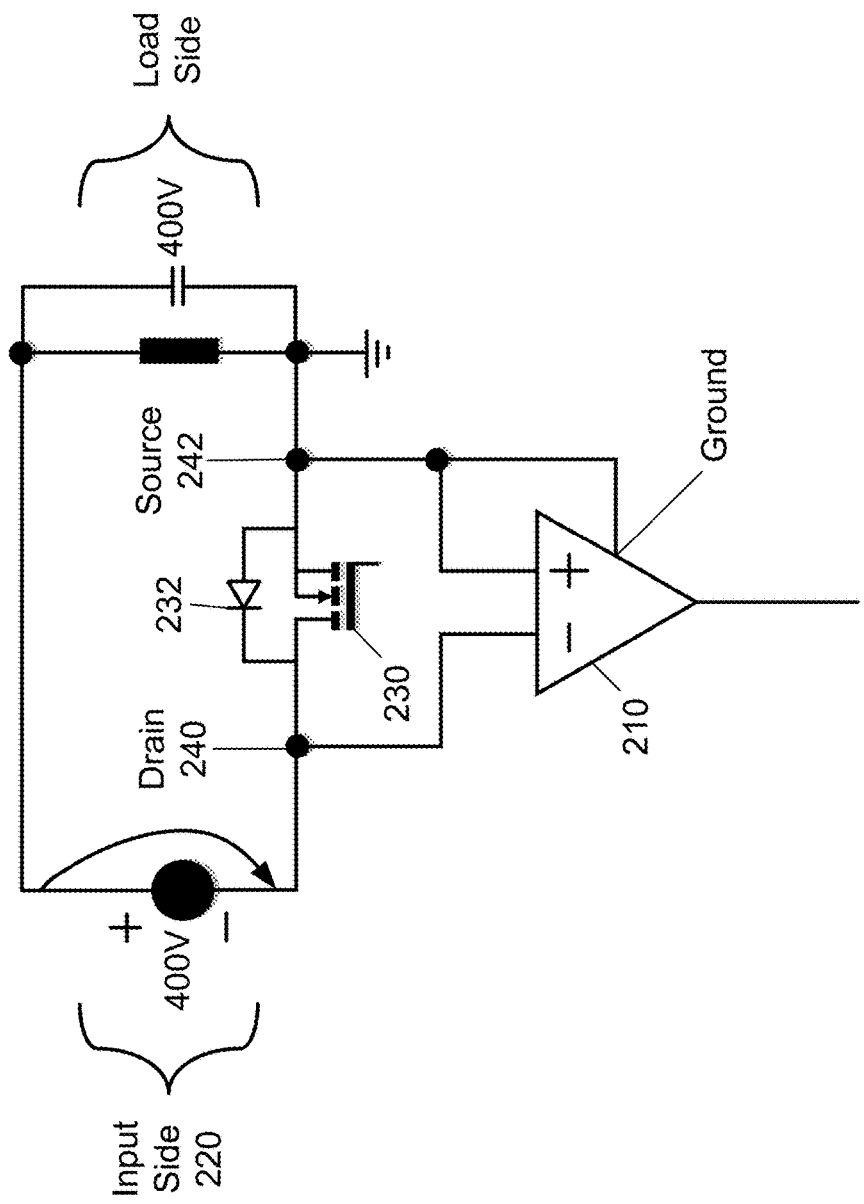
FIG. 2 is another example protection circuit in accordance with implementations of the disclosure.

Alternatively, a low common voltage differential amplifier 210 may be used as shown in FIG. 2 on the low side to sense the current flowing through an Oring circuit including Oring MOSFET 230 and a diode 232 connected in parallel the Oring MOSFET. The low common voltage differential amplifier 210 may be, for example, a comparator that supports differential voltages of less than 20V such as a commercially available LT1018 comparator. This will require that the comparator 210 is connected to the output ground load. As such, when the input side 220 has a short and the source 242 voltage is very low or zero (because source is connected to ground and ground is referred to as zero potential), the output 400V will be applied to the drain 140 of the Oring MOSFET 230. Accordingly, as with the example of protection circuit 100, there will be still high voltage across the comparator 210, resulting in damage to the system. In addition, this is only feasible for low side sensing.

Figure 3A:
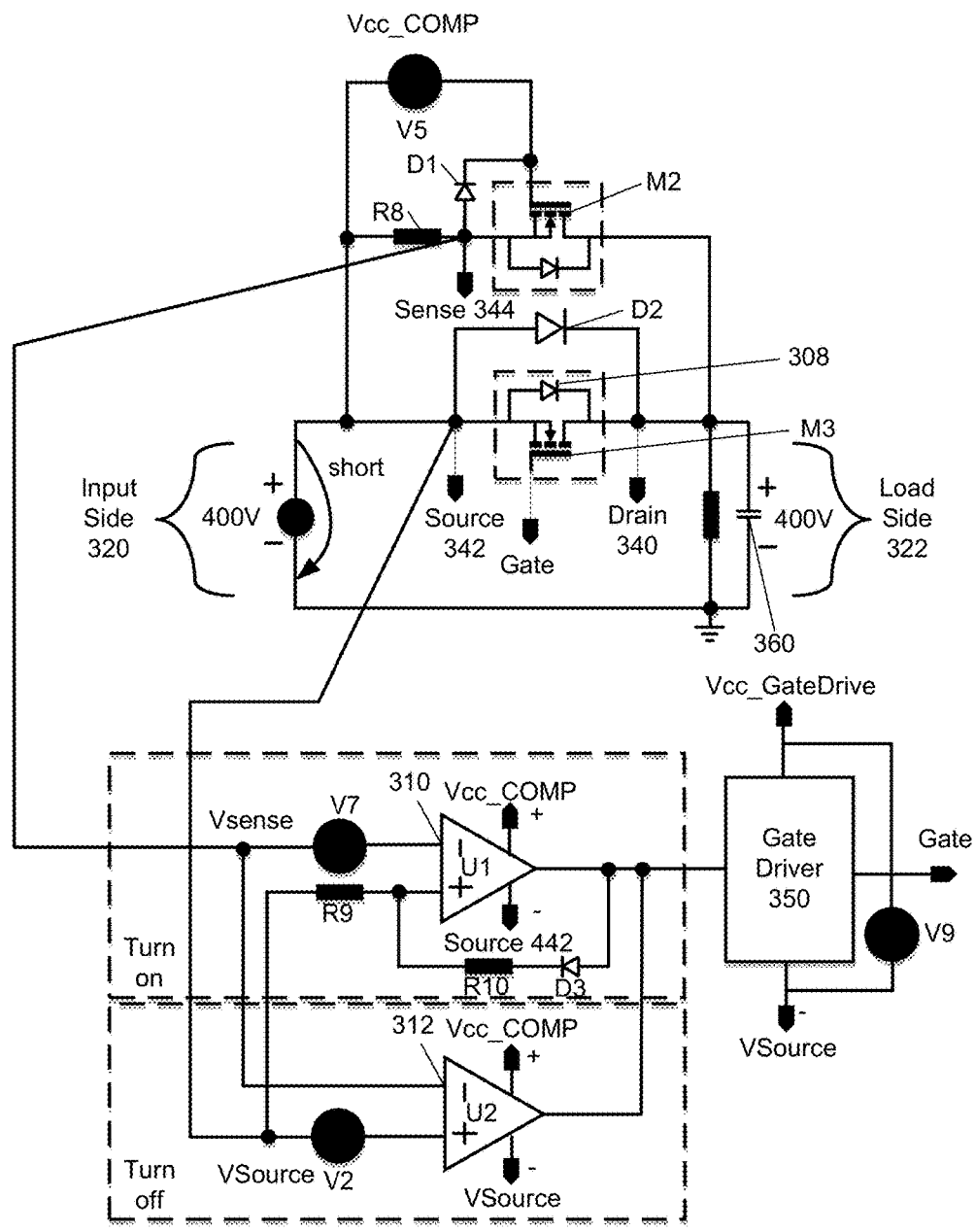
FIGS. 3A and 3B are a further example protection circuit in accordance with implementations of the disclosure.
Figure 3B:
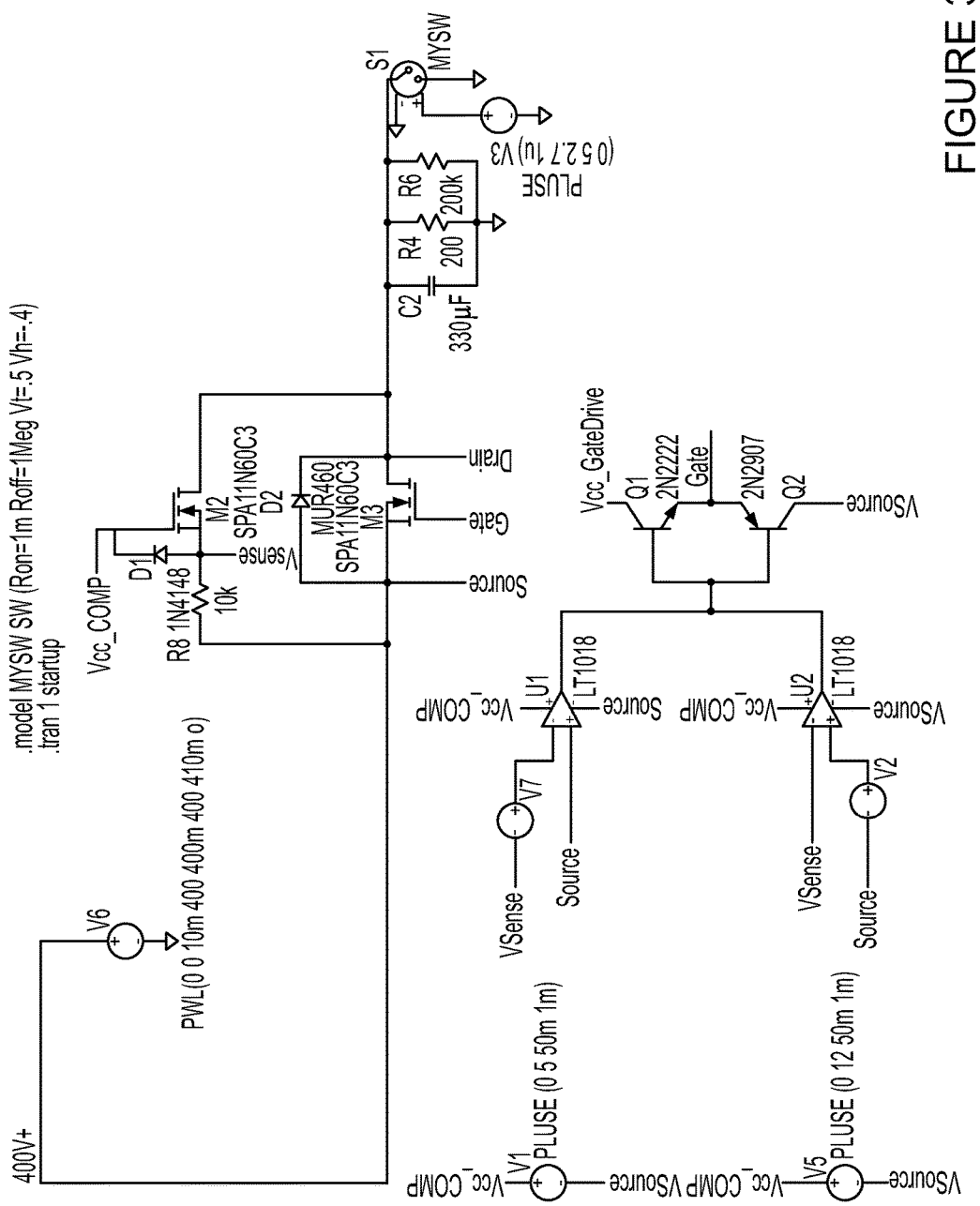
Figure 4A:
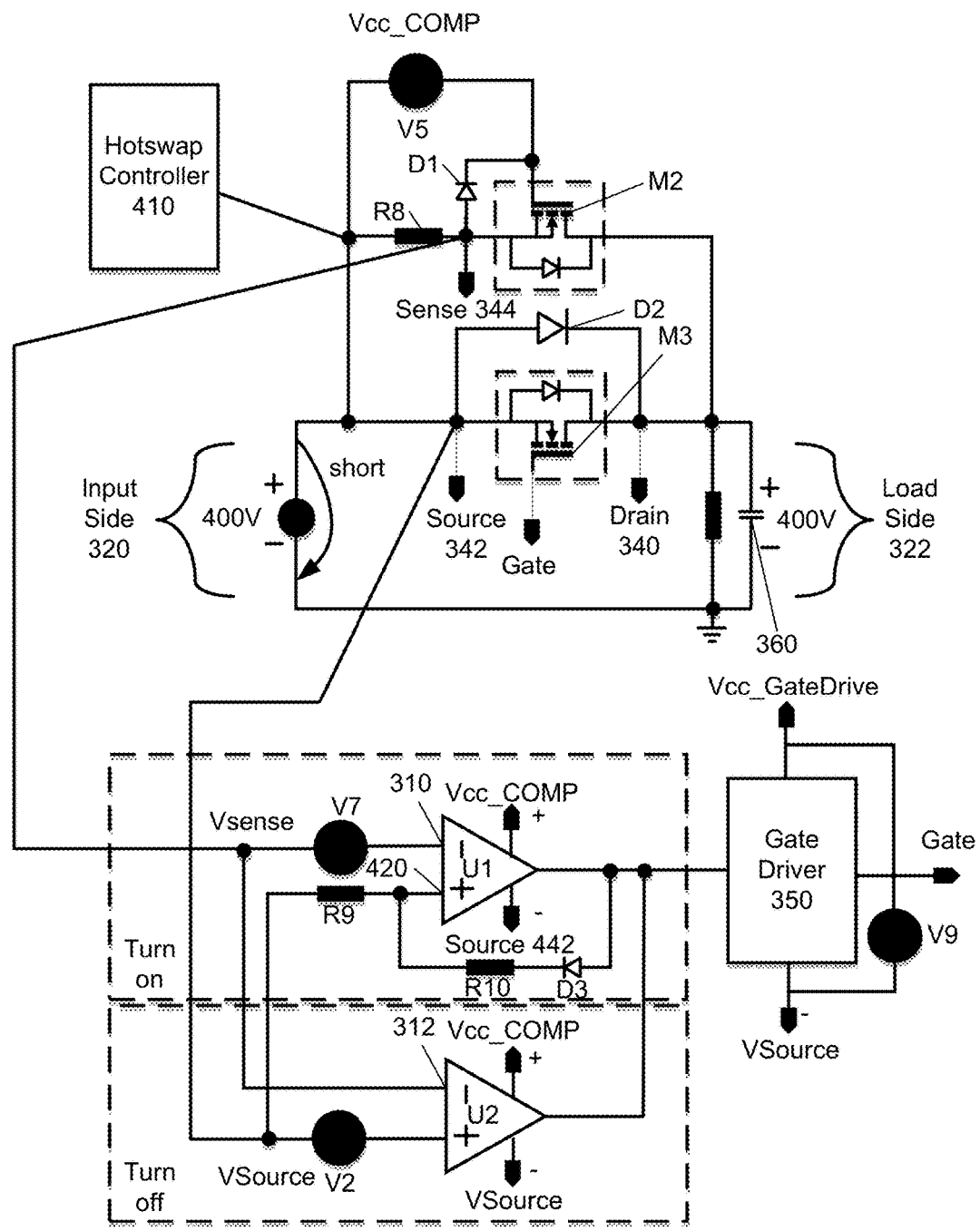
FIGS. 4A and 4B are a further example protection circuit with hotswap control in accordance with implementations of the disclosure.
Figure 4B:
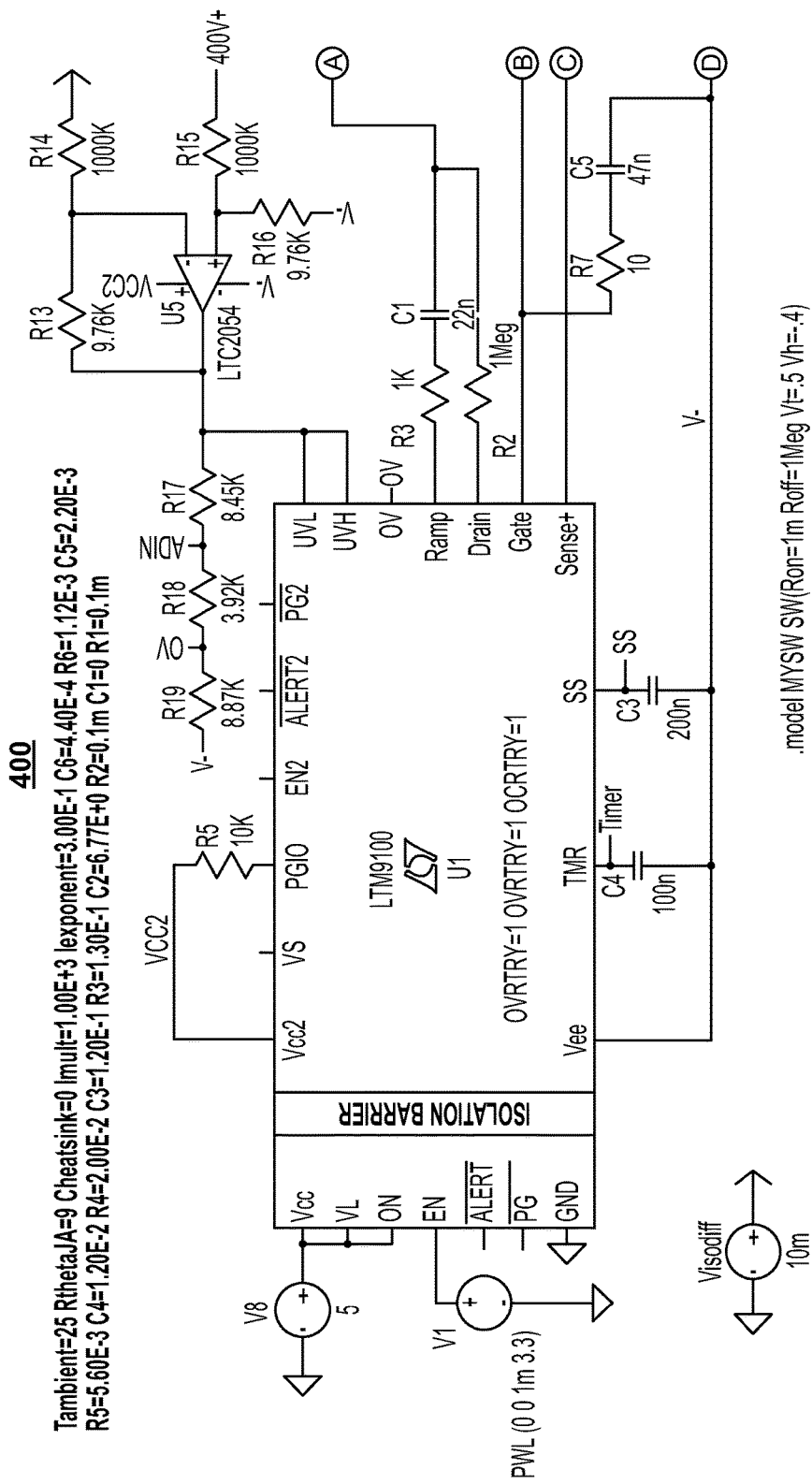
Figure 4B:
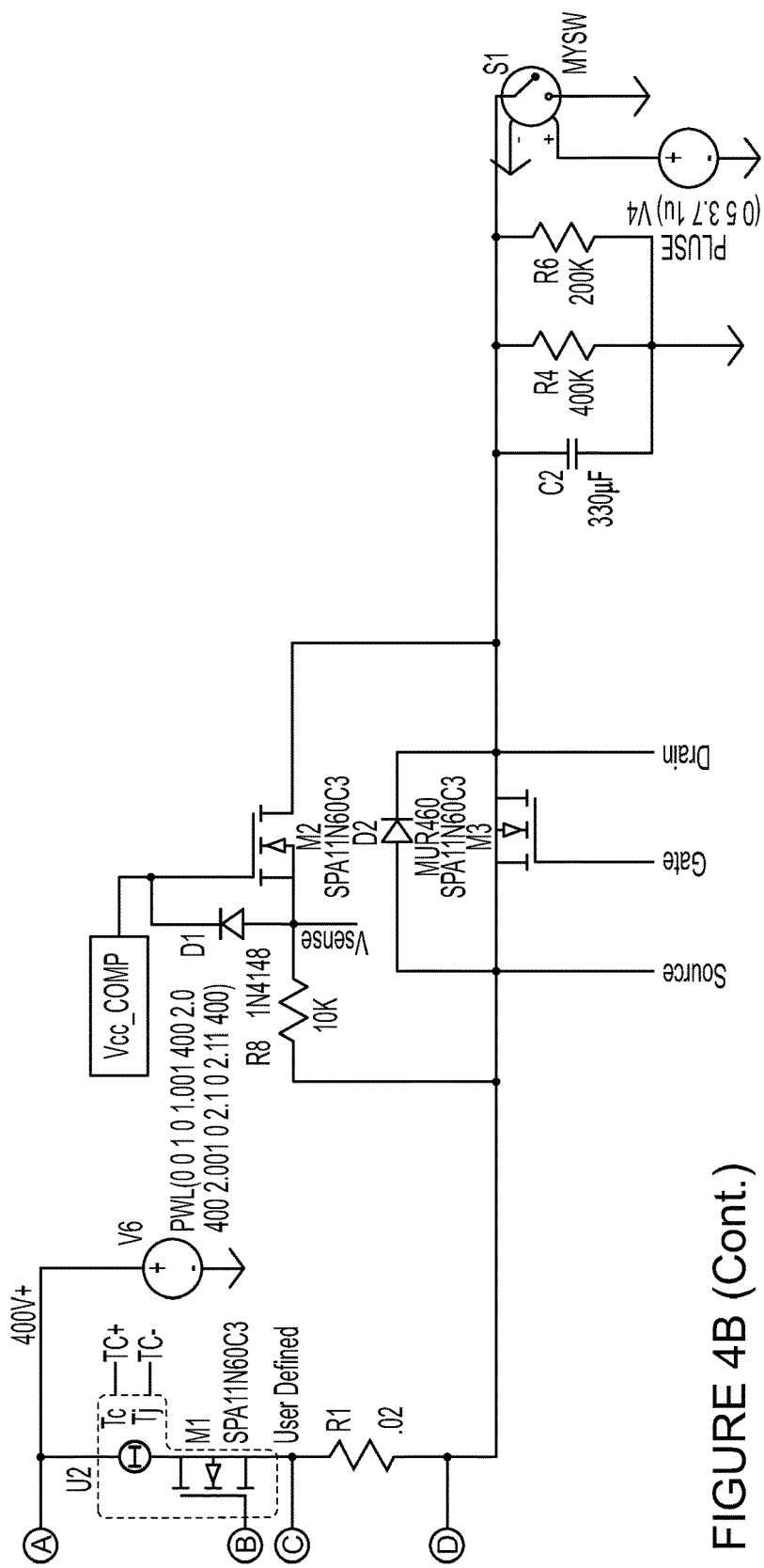
Figure 4B:
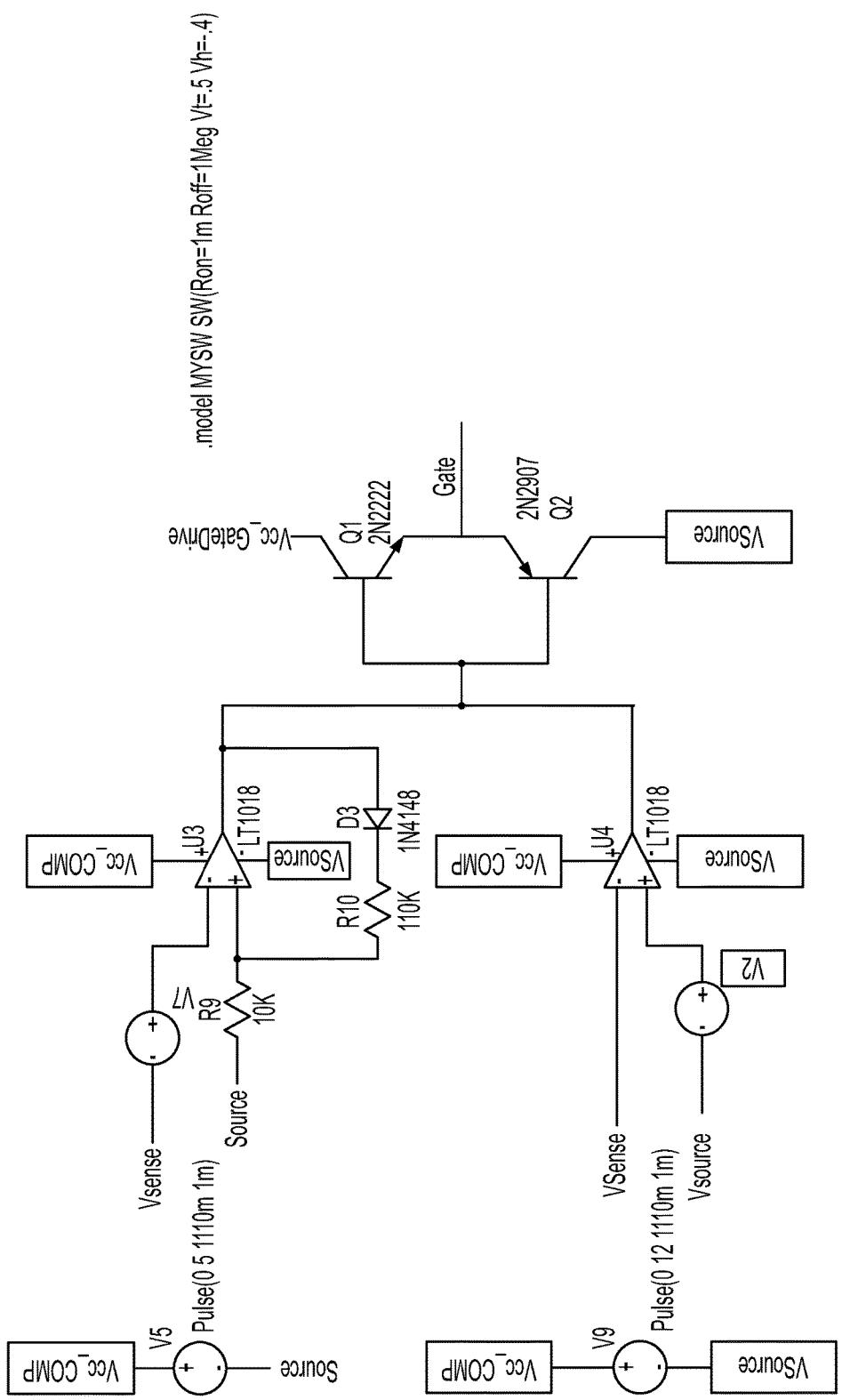

To address these deficiencies with the low common voltage difference amplifier of protection circuit 100 and allow for high side and low side sensing, a clamping circuit may be utilized. For example, FIGS. 3A and 3B, depict an example configuration of a protection circuit 300 for high side sensing with a pair of low common voltage difference amplifiers or comparators U1 and U2, an Oring circuit (including an Oring MOSFET M2 and a diode 308 connected in parallel with the Oring MOSFET), and a clamping circuit. Protection circuit 300 will be described with regard to FIG. 3A, although FIG. 3B provides additional example implementation details. FIGS. 4A and 4B depict an example of the protection circuit 300 of FIGS. 3A and 3B depicted with a Hotswap circuit including a Hotswap controller such as a commercially available LT9100 Hotswap controller. In these examples, M3 is an Oring MOSFET as described above. The clamping circuit includes an additional MOSFET M2, resistor R8 and diode D1.

M2 acts to clamp the Vsense nodes 310, 312 of the comparators U1, U2 so that when the input side 320 has as short, the voltage on the Vsense nodes will be clamped to below the maximum rating of the comparator. In other words, the voltage to the comparators will not exceed the maximum voltage or Vcc_COMP of the comparators. M2 is connected in parallel with M3, and as such, the M2 forms a source follower. Thus, when the drain of M2 sees a higher voltage, the current flows through the channel and raises the voltage at the source 342 to roughly Vcc_COMP-Vth, where Vcc_COMP is the fixed gate voltage and the Vth is the threshold of the MOSFET. Eventually, M2 will be in the linear mode and the current will be limited by the resistor R8. At this point, the peak power of M3 is 400V*Vth/R8=180 mW, resulting in the Vsense being clamped to about 2.5V. This clamping allows for the use of the low common voltage difference amplifier without causing damage to the protection circuit. D1 may be an ultrafast or Schottky diode which clamps fast transient spikes.

During normal operation, M3 will be switched to the on condition and the voltage across M2 will be very low, for example 0.2V or more or less. Accordingly, M2 will be switched to the on condition as well, since the gate voltage at the M2 (Vgs) is at Vcc_COMP (5V), and the current flow through M2 will be very small, roughly 350 uA. The voltage across M2 is very low or 350 uA*Rdon<1 mV, allowing the protection circuit 300 to use the differential voltage between Vsense (the voltage at Vsense 344) and Vsource (the voltage at the source 342 of M3) to sense the voltage across M3.

Comparators U1 and U2 may be window comparators (such as LT1018) used for detecting two events: 1) a big positive voltage during reverse conduction and 2) a big negative voltage during start up. U1 is arranged with a single sided hysteresis clamping diode D3 for one-direction hysteresis. The comparator U1 is configured to turn M3 to the on condition based on the differential voltage between Vsense and Vsource, while the comparator Us is configured to turn M3 to the off condition based upon the differential voltage between Vsense and Vsource.

For a startup event (e.g., starting up the power to the rack), the body diode of M2 will be on initially and the comparator U1 should sense ~1V. This will cause the gate driver 350 to turn M3 to the on condition. When the comparator U1 has a low output, there is no hysteresis. If the Vsense is lower than the threshold V7 (for example if Vsense is −0.7V) and assuming the source of M3 is 0 potential, the comparator U1 outputs high which causes the gate driver 350 to turn M3 to the on condition to reduce the conduction loss. At this point, the body diode of the M3 and external diode D2 may both conduct. While the comparator U1 outputs high, there will be feedback from the output Vcc_COMP through D3 to the non-inverting node 420 of the comparator U1.

After M3 turns on, and assuming the source of M3 is 0 potential, the sensed voltage Vsense (Ids*Rdson) will be lower (~−0.2V). To make M3 continue turning towards the on condition, the threshold for turning on M3 must be lowered by the one directional hysteresis. So D3 is helpful to increase the voltage on the non-inverting node 420 and hold M3 in the on condition. As such, only when the Vsense is higher than −(V7−(Vcc_COMP-VF)*R9*(R10+R9)), M3 will be switched to the off condition, where VF is the diode voltage drop of D3.

When a short occurs at the input side 320, the reverse current will flow through M3, so M3 must be switched to the off condition right away. Comparator U2 may set a threshold (V2) for reverse current protection. When the Vsense is higher than Vsource+V2 at comparator U2, the gate driver 350 will cause M3 to be switched to the off condition.

When an overload occurs at the load side 322, the comparator U2 will sense a high current which can be used to control a Hotswap circuit in order to protect the input side 320. Referring to example protection circuit 400 of FIGS. 4A and 4B, as noted above, the protection circuit 300 may be utilized with a Hotswap controller 410, an example implementation is shown in detail in FIG. 4B.

Figure 5:
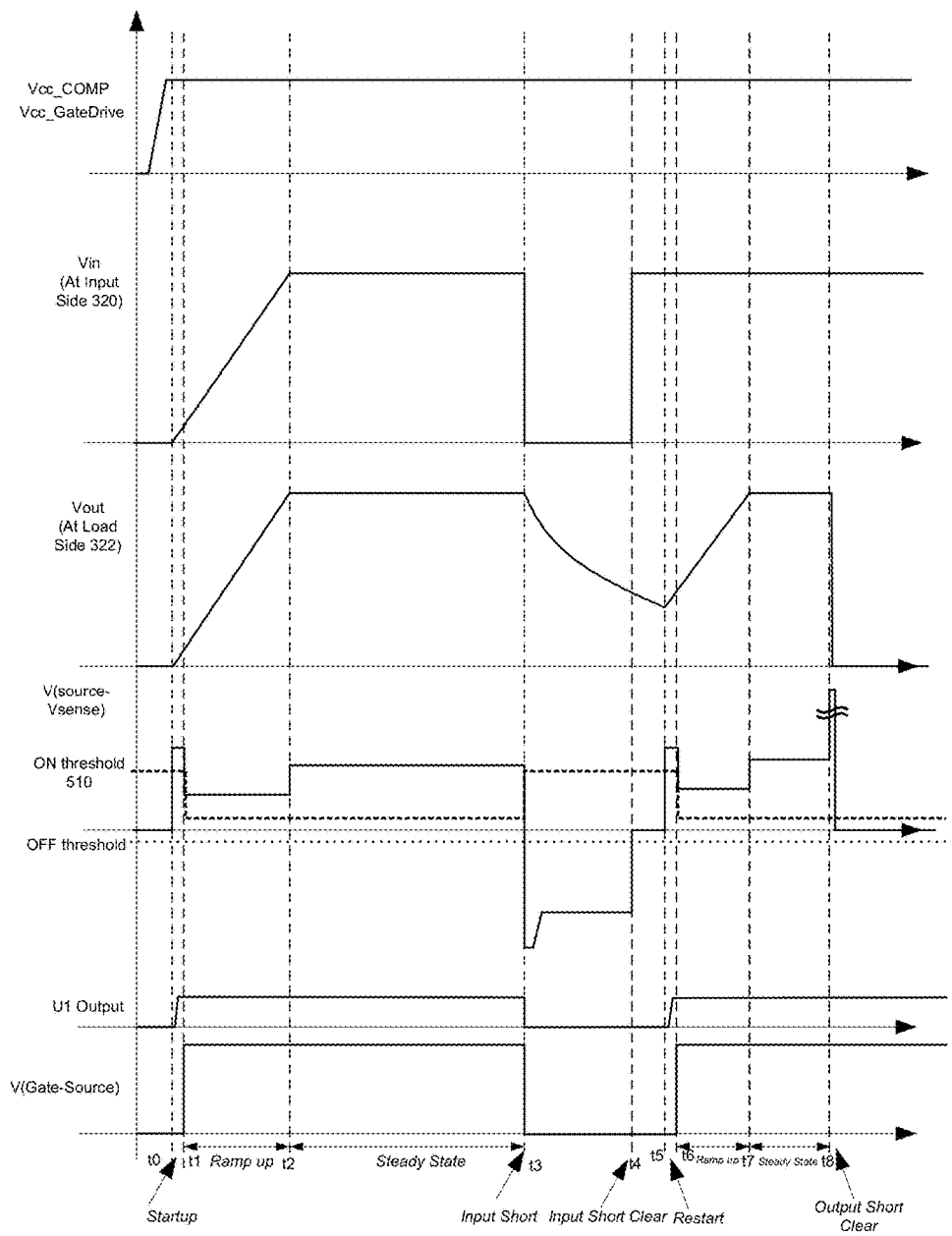
FIG. 5 is an example of waveforms of the protection circuit of FIGS. 4A and 4B in accordance with implementations of the disclosure.

FIG. 5 is an example of waveforms of protection circuit 400 in a rack at OA loading for the example sequence of initialization (t0), ramp up (t1), steady state (t2, normal operation), input short (t3-t4), restart (t5) ramp up (t6), steady state (t7), and output short (t8).

Before t0, the internal control voltage source, for example Vcc_COMP and Vcc_GateDrive are ramping up to a valid value. At t0, the hotswap or input is connected to the protection circuit, so current starts to flow via D2 and/or D1. Because there will be very small current flow through M2, Vgs of M2 will be roughly Vcc_COMP (5V), and M2 will be turned to the on condition by the gate driver. So the sensed voltage difference of Source and Vsense (Source-Vsense) is roughly equal to the voltage difference between Source and Drain of M3.

Between t0 and t1 and during initialization, because current starts to flow via D2 and the body diode of the M3, Vsource-Vsense will be around 1V, which will be higher than V7. As a result, U3 will output high and the gate of M3 will also be high. Via the one-directional hysteresis, D3, R9 and R10, the on threshold of M3 will be reduced to a lower level, as shown by the dashed line 510 of FIG. 5. This will help the M3 to stay in the on condition. After M3 is in the on condition, the differential voltage, Vsource-Vsense, is the drain current of the MOSFET times the resistance of the MOSFET in the on condition or Ids*Rdson, which is <1V.

After startup and between t1 and t2 (the ramp up), Vin (voltage into the protection circuit from the load side 320) and Vout (voltage out to the load devices on the load side 330) are ramping up. Afterwards, from t2 and t3, the rack reaches the steady state.

At t3, the input side 320 has a short event (input short), so initially, the holdup capacitor 360 on the load side 322 will charge via M2. As such, the differential voltage (Vsource- Vsense) is negative, and U2 will output low right away, causing the gate driver 350 to switch M3 to the off condition. However, after being switched to the off condition, without the clamping circuit, there will be 400V across Vgs of M3, which will likely cause damage to the rack and possibly any connected load devices thereon. With the clamping circuit, the absolute value of the differential voltage (Vsource−Vsense) remains below a few volts, e.g., less than about 2.5 volts or more or less6. In other words, when there is a high voltage across M3's drain 340 and source 342 during an input short, current will flow from drain to source of M2 via R8, so the voltage of the Vsense will be increased and until the Vgs of M2 (=Vcc_COMP−Vsense) is reduced to the threshold of the M2 (~2V). M2 will be in linear mode, so most of the high voltage between M3's drain and source will be across M2 which will leave only about 2V across R8 (=Vcc_COMP−Vth). So the differential voltage for comparator U1, comparator U2, etc. is also clamped.

At t4 the short is cleared (power is restored via the power source) and the rack is restarted at t5. Thereafter, between t5 to t8, the rack operates as between t0 up until t3. However, at t8, a short on the load side occurs and is shortly thereafter cleared. The short on the load side causes the Hotswap MOSFET M1 (See FIG. 4B) to be switched to the off condition, disconnecting the protection circuit from the input.

Although the clamping circuit described above and shown in the figures is depicted in a particular configuration, there is merely one example arrangement of a MOSFET, resistor and diode which can be used as a clamping circuit.

Figure 6:
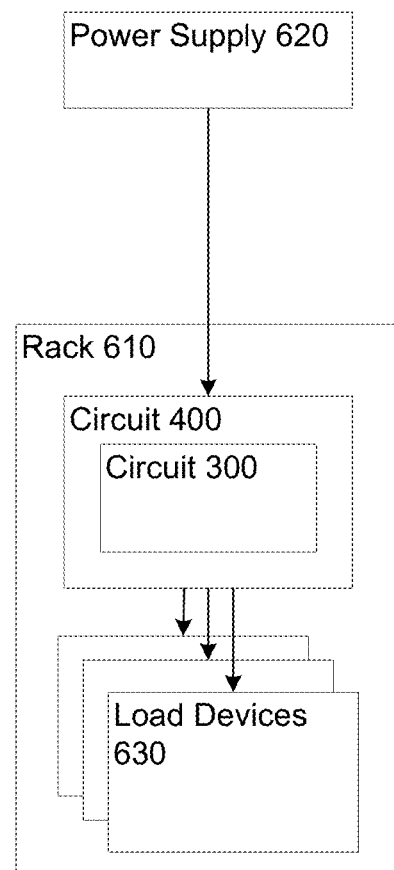
FIG. 6 is an example of a system including a rack having a protection circuit, and a power supply in accordance with implementations of the disclosure.

FIG. 6 is an example of a system 600 including a rack 610 including protection circuit 400 (protection circuit 300 with hotswap) as discussed above (or at least protection circuit 300 without the hotswap) and a power supply 620. Again, power supply 620 may provide greater than 48V DC, such as 400V or even greater voltages. Within the rack is a set of one or more load devices 630 which are connected to protection circuit 400. As noted above, the load devices power conversion devices, motherboards, processing chips, network switches, accelerators, and any other devices which utilize power provided by the protection circuit 400. The arrows of FIG. 6 represent optimal directions of current flow. As in the examples above, the protection circuit 400 may connect and disconnect the load devices 630 to the power supply 620 safely (via the Hotswap controller 410) and at the same time provide both input side and low side sensing.

The features described herein utilize Hotswap and Oring functions to prevent undesired interference to a high voltage DC bus. As noted above, a low common voltage difference amplifier can be used without high side current sensing circuitry, reducing costs and simplifying implementation. In particular, a low voltage integrated circuit (<20V) can be used to resolve the problems of a high voltage DC (at 20x higher voltage level), saving significantly in implementation costs for each server tray in the rack. The configurations discussed herein allow for both high side and low side Oring control with a Hotswap. These features with a DC fuse on the high side obviate the need for a DC fuse (an expensive component) on the return side for safety requirements. Thus, the configurations can be used for very high power racks without affecting the costs of the power distribution system. Moreover, due to the higher power efficiency of high voltage DC racks, additional savings may also be expected in terms of size (physical space required to house the racks and components within the racks), energy needed for cooling as the system is more efficient, density within the racks as more devices can be supported by the same rack, costs of bus bar copper, etc.

As these and other variations and combinations of the features discussed above can be utilized without departing from the subject matter defined by the claims, the foregoing description of the embodiments should be taken by way of illustration rather than by way of limitation of the subject matter defined by the claims. It will also be understood that the provision of the examples disclosed herein (as well as clauses phrased as "such as," "including" and the like) should not be interpreted as limiting the claimed subject matter to the specific examples; rather, the examples are intended to illustrate only one of many possible embodiments. Further, the same reference numbers in different drawings may identify the same or similar elements.

The invention claimed is:

1. A system for protecting server racks connected to a power supply, the system comprising:
   an Oring circuit including a first MOSFET, a first diode connected in parallel with the first MOSFET, and first and second comparators operatively coupled to the first MOSFET, each of the first and second comparators supporting a maximum voltage difference that is less than an operational voltage of the power supply; and
   a clamping circuit including a second MOSFET and a second diode operatively coupled to the Oring circuit, and
   wherein each of the first and second comparators are configured to compare voltage at the first MOSFET with voltage at the second MOSFET, the first comparator being configured to switch the first MOSFET to an off condition according to the compared voltage and the second comparator being configured to switch the first MOSFET to an on condition according to the compared voltage, the second MOSFET being configured to clamp a node of the first comparator and a node of the second comparator to below the maximum voltage difference when there is a short at the power supply.

2. The system of claim 1, wherein each of the first and second comparators support voltages of no more than 20V.

3. The system of claim 2, further comprising a server rack.

4. The system of claim 3, wherein an operational voltage of the power supply when the power supply supplies power to operate computing components of the server rack is greater than 48V.

5. The system of claim 4, wherein the operational voltage of the power supply when the power supply supplies power to operate computing components of the server rack is 400V.

6. The system of claim 1, wherein the second diode is a Schottky diode configured to clamp transient spikes.

7. The system of claim 6, further comprising the power supply.

8. The system of claim 1, further comprising a Hotswap controller configured with a third MOSFET such that the third MOSFET is arranged with the Oring circuit and clamping circuit to disconnect a load from the power supply when there is a load side short of the system.

9. The system of claim 1, wherein the clamping circuit further includes a resistor that limits current from the power supply to the second MOSFET.

10. The system of claim 1, wherein the Oring circuit further includes a third diode configured as a single sided hysteresis clamping diode.

11. The system of claim 10, wherein the Oring circuit further includes first and second resistors such that the third diode and the first and second resistors are arranged to reduce a voltage value of a threshold of the first comparator when the first MOSFET is switched to the on condition.

12. The system of claim 11, wherein the first comparator is arranged to have a first threshold for switching the first MOSFET to the on condition when the first MOSFET is operating in a linear region or in the off condition, and wherein the first comparator has a second threshold for keeping the first MOSFET in the on condition when the first MOSFET is already operating in the on condition, the first threshold being a greater voltage than the second threshold.

13. The system of claim 12, wherein the second comparator has a single voltage threshold for switching the first MOSFET to the off condition, such that when voltage at the second MOSFET is greater than the single voltage threshold, the second comparator will cause the first MOSFET to switch to the off condition.

14. A protection circuit for protecting server racks connected to a power supply, the protection circuit comprising:
an Oring circuit including a first MOSFET, a first diode connected in parallel with the first MOSFET, and first and second comparators operatively coupled to the first MOSFET, each of the first and second comparators supporting a maximum voltage difference that is less than an operational voltage of the power supply; and
a clamping circuit including a second MOSFET and a second diode operatively coupled to the Oring circuit; and
a Hotswap controller configured with a third MOSFET such that the third MOSFET is arranged with the Oring circuit and clamping circuit to disconnect a load from the power supply when there is a load side short of the protection circuit, and
wherein each of the first and second comparators are configured to compare voltage at the first MOSFET with voltage at the second MOSFET, the first compara-
tor being configured to switch the first MOSFET to an off condition according to the compared voltage and the second comparator being configured to switch the first MOSFET to an on condition according to the compared voltage, the second MOSFET being configured to clamp a node of the first comparator and a node of the second comparator to below the maximum voltage difference when there is a short at the power supply.

15. The protection circuit of claim 14, wherein each of the first and second comparators support voltages of less than 20V.

16. The protection circuit of claim 14, wherein the second diode is a Schottky diode that clamps transient spikes.

17. The protection circuit of claim 14, wherein the clamping circuit further includes a resistor which limits current from the power supply to the second MOSFET.

18. The protection circuit of claim 14, wherein the Oring circuit further includes a third diode configured as a single sided hysteresis clamping diode D3.

19. The protection circuit of claim 18, wherein the Oring circuit further includes first and second resistors such that the third diode and the first and second resistors are arranged to reduce a voltage value of a threshold of the first comparator when the first MOSFET is switched to the on condition.

20. The protection circuit of claim 19, wherein the first comparator is arranged to have a first threshold for switching the first MOSFET to the on condition when the first MOSFET is operating in a linear region or in the off condition, and wherein the first comparator has a second threshold for keeping the first MOSFET in the on condition when the first MOSFET is already operating in the on condition, the first threshold being a greater voltage than the second threshold.

* * * * *